United States Patent
Kim et al.

(10) Patent No.: US 9,381,653 B2
(45) Date of Patent: Jul. 5, 2016

(54) ROBOT AND SUBSTRATE HANDLING APPARATUS INCLUDING THE SAME

(71) Applicant: Samsung Electronics Co., Ltd., Suwon-si, Gyeonggi-do (KR)

(72) Inventors: Byeongsang Kim, Suwon-si (KR); Kang-Min Park, Hwaseong-si (KR); Jungjun Park, Hwaseong-si (KR); JaeChul Hwang, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/643,702

(22) Filed: Mar. 10, 2015

(65) Prior Publication Data

US 2015/0251323 A1    Sep. 10, 2015

(30) Foreign Application Priority Data

Mar. 10, 2014  (KR) .................. 10-2014-0027896

(51) Int. Cl.
*H01L 21/677* (2006.01)
*B25J 19/00* (2006.01)
*B25J 15/00* (2006.01)
*B25J 11/00* (2006.01)

(52) U.S. Cl.
CPC .......... *B25J 19/0091* (2013.01); *B25J 11/0095* (2013.01); *B25J 15/0014* (2013.01); *H01L 21/67766* (2013.01)

(58) Field of Classification Search
CPC .............. B25J 11/0095; B25J 15/0014; B25J 19/0091; B25J 19/028; H01L 21/67742; H01L 21/67766

USPC ......................................................... 294/213
See application file for complete search history.

(56) References Cited

U.S. PATENT DOCUMENTS

| | | |
|---|---|---|
| 4,495,434 A | 1/1985 | Diepers et al. |
| 4,574,438 A | 3/1986 | Diepers et al. |
| 4,598,813 A | 7/1986 | Ray |
| 4,764,033 A | 8/1988 | Kohring et al. |
| 4,792,715 A | 12/1988 | Barsky et al. |
| 4,821,584 A | 4/1989 | Lembke |
| 4,990,815 A | 2/1991 | Lindner et al. |
| 5,049,775 A | 9/1991 | Smits |
| 5,136,201 A | 8/1992 | Culp |
| 5,442,270 A | 8/1995 | Tetsuaki |
| 5,499,745 A | 3/1996 | Derian et al. |
| 5,656,902 A | 8/1997 | Lowrance |
| 5,719,481 A | 2/1998 | Mo |
| 5,744,728 A | 4/1998 | Suita et al. |

(Continued)

FOREIGN PATENT DOCUMENTS

| | | |
|---|---|---|
| EP | 1 803 962 A2 | 7/2007 |
| JP | H04-247493 A | 9/1992 |

(Continued)

*Primary Examiner* — Dean Kramer
(74) *Attorney, Agent, or Firm* — Harness, Dickey & Pierce, PLC

(57) ABSTRACT

The robot including a main body, an arm connected to the main body, a hand connected to the arm, the hand including a hand base and a finger, and a hand bracket unit between the hand base and the finger or between the hand base and the arm, may be provided. The hand bracket unit may include a vibration damping member provided between the hand base and the finger or between the hand base and the arm, thereby damping vibration of the hand base or the finger.

18 Claims, 13 Drawing Sheets

(56) References Cited

U.S. PATENT DOCUMENTS

| | | | |
|---|---|---|---|
| 5,973,440 A | 10/1999 | Nitzsche et al. | |
| 6,296,093 B1 | 10/2001 | Norris et al. | |
| 6,578,893 B2 | 6/2003 | Soucy et al. | |
| 6,583,859 B2 | 6/2003 | Miyajima et al. | |
| 6,587,750 B2 | 7/2003 | Gerbi et al. | |
| 6,598,717 B1 | 7/2003 | Wang et al. | |
| 6,634,686 B2 | 10/2003 | Hosokawa | |
| 6,761,085 B1 * | 7/2004 | Tan | 74/490.01 |
| 6,863,323 B2 | 3/2005 | Neveu | |
| 6,893,712 B2 * | 5/2005 | Aoyagi et al. | 428/297.4 |
| 6,979,932 B2 | 12/2005 | Hamann et al. | |
| 7,073,834 B2 | 7/2006 | Matsumoto et al. | |
| 7,105,984 B2 | 9/2006 | Miyazawa | |
| 7,186,442 B2 | 3/2007 | Myers et al. | |
| 7,331,253 B2 | 2/2008 | Burkert et al. | |
| 7,553,121 B2 | 6/2009 | Curotto et al. | |
| 7,578,069 B2 | 8/2009 | Eaton | |
| 7,586,242 B2 | 9/2009 | Yokoyama et al. | |
| 7,880,370 B2 | 2/2011 | Churchill et al. | |
| 8,063,383 B2 | 11/2011 | Pryadkin et al. | |
| 8,160,205 B2 | 4/2012 | Saracen et al. | |
| 8,176,786 B2 | 5/2012 | Sohn et al. | |
| 8,322,698 B2 | 12/2012 | Bretschneider et al. | |
| 8,360,997 B2 | 1/2013 | Ferrara | |
| 8,525,387 B2 | 9/2013 | Kamijo et al. | |
| 8,585,115 B2 * | 11/2013 | Fairhurst et al. | 294/213 |
| 8,725,431 B2 | 5/2014 | Yamashita | |
| 8,745,789 B2 | 6/2014 | Saracen et al. | |
| 8,827,339 B2 | 9/2014 | Takemura et al. | |
| 8,852,979 B2 | 10/2014 | Min et al. | |
| 8,855,816 B2 | 10/2014 | Urano | |
| 2002/0041102 A1 | 4/2002 | Krauskopf et al. | |
| 2005/0285419 A1 | 12/2005 | Matsumoto et al. | |
| 2007/0193757 A1 | 8/2007 | Bar-Cohen et al. | |
| 2007/0281095 A1 | 12/2007 | Hoefflin et al. | |
| 2008/0247857 A1 * | 10/2008 | Yuasa et al. | 414/680 |
| 2008/0297340 A1 | 12/2008 | Popa et al. | |
| 2009/0047471 A1 | 2/2009 | Kellenberger | |
| 2009/0301198 A1 | 12/2009 | Sohn et al. | |
| 2010/0089524 A1 | 4/2010 | Yokoyama et al. | |
| 2010/0194240 A1 | 8/2010 | Churchill et al. | |
| 2012/0154131 A1 | 6/2012 | Lee et al. | |
| 2012/0174317 A1 | 7/2012 | Saracen et al. | |
| 2012/0204656 A1 | 8/2012 | Suzuki | |
| 2012/0316674 A1 | 12/2012 | Urano | |
| 2013/0140954 A1 | 6/2013 | Kamijo et al. | |
| 2013/0216724 A1 | 8/2013 | Lee et al. | |
| 2014/0311678 A1 | 10/2014 | Anderson et al. | |

FOREIGN PATENT DOCUMENTS

| | | |
|---|---|---|
| JP | H05-244782 A | 9/1993 |
| JP | H06-091583 | 4/1994 |
| JP | H07-251115 A | 10/1995 |
| JP | H08-011085 | 1/1996 |
| JP | H08-047888 | 2/1996 |
| JP | H09-225883 A | 9/1997 |
| JP | H10-277975 A | 10/1998 |
| JP | H11-165289 A | 6/1999 |
| JP | 2000-000673 A | 1/2000 |
| JP | 2001-229446 A | 8/2001 |
| JP | 2003-505266 A | 2/2003 |
| JP | 2004-181623 A | 7/2004 |
| JP | 2005-051949 A | 2/2005 |
| JP | 2006-041496 A | 2/2006 |
| JP | 3811495 B2 | 8/2006 |
| JP | 2006-527082 A | 11/2006 |
| JP | 2009-517233 A | 4/2009 |
| JP | 2009-160685 A | 7/2009 |
| JP | 2010-131676 A | 6/2010 |
| JP | 2010-253566 A | 11/2010 |
| JP | 2010-280507 A | 12/2010 |
| JP | 4729499 B2 | 7/2011 |
| JP | 2011-183525 A | 9/2011 |
| JP | 2012-010520 A | 1/2012 |
| JP | 2012-037039 A | 2/2012 |
| JP | 4980712 B2 | 7/2012 |
| JP | 2012-161885 A | 8/2012 |
| JP | 2012-210049 A | 10/2012 |
| JP | 2012-210050 A | 10/2012 |
| JP | 2012-210051 A | 10/2012 |
| JP | 2012-210052 A | 10/2012 |
| JP | 2012-210053 A | 10/2012 |
| JP | 2012-253989 A | 12/2012 |
| JP | 2012-253990 A | 12/2012 |
| JP | 2012-257424 A | 12/2012 |
| KR | 10-1991-0007637 | 5/1991 |
| KR | 20-1996-0026837 | 10/1998 |
| KR | 20-1997-0008385 | 10/1998 |
| KR | 20-1996-0000741 | 1/1999 |
| KR | 20-1996-0000743 | 1/1999 |
| KR | 20-2000-0018192 | 10/2000 |
| KR | 10-2002-0059344 | 7/2002 |
| KR | 10-2004-0047652 | 6/2004 |
| KR | 10-2006-0016116 | 2/2006 |
| KR | 10-2006-0046530 B1 | 5/2006 |
| KR | 10-0768702 B1 | 10/2007 |
| KR | 10-2007-0037563 | 1/2008 |
| KR | 10-0822995 B1 | 4/2008 |
| KR | 10-0836612 B1 | 6/2008 |
| KR | 10-2009-0027336 | 3/2009 |
| KR | 10-2009-0032279 | 5/2009 |
| KR | 10-2009-0044080 | 7/2009 |
| KR | 10-2009-0044079 | 4/2010 |
| KR | 10-0950876 B1 | 4/2010 |
| KR | 10-2012-0036268 | 4/2012 |
| KR | 10-2012-0037882 | 4/2012 |
| KR | 10-2012-0069980 | 6/2012 |
| KR | 10-2012-0093779 | 8/2012 |
| KR | 10-2013-0063471 | 6/2013 |

* cited by examiner

ROBOT AND SUBSTRATE HANDLING APPARATUS INCLUDING THE SAME

CROSS-REFERENCE TO RELATED APPLICATIONS

This U.S. non-provisional patent application claims priority under 35 U.S.C. §119 to Korean Patent Application No. 10-2014-0027896, filed on Mar. 10, 2014, in the Korean Intellectual Property Office, the entire contents of which are hereby incorporated by reference.

BACKGROUND

Some example embodiments of the inventive concepts relate to robots and/or substrate handling apparatuses including the same, and in particular, to vibration damping robots and/or substrate handling apparatuses including the same.

There is an increasing demand for a larger-area substrate in a semiconductor wafer or a liquid crystal display panel. The larger-area substrate should be safely handled in a fabrication line because the larger-area substrate is more fragile than a smaller-area one. In order to mitigate or prevent a yield drop resulting from breakage of the substrate due to the fragility of the larger-area substrate, a robot is being used to carefully transfer the larger-area substrate.

The robot may include a hand-shaped portion (hereinafter, hand) for supporting a larger-area substrate. When the robot starts to move or stop, such an instantaneous acceleration of the robot may result in vibration of a finger-shaped portion of the hand. In certain cases, such a vibration may continue for several tens of seconds. If the vibration continues even when the larger-area substrate transferred from a first apparatus is accommodated in a second apparatus, the larger-area substrate may undesirably collide with the second apparatus. Accordingly, a completion of the transferring step may be delayed until the amplitude of the vibration is reduced below a specific value, thereby reducing productivity of the fabrication.

SUMMARY

Some example embodiments of the inventive concepts provide robots capable of effectively damping vibration and substrate handling apparatuses including the same.

According to an example embodiment of the inventive concepts, a robot includes a main body, an arm connected to the main body, a hand connected to the arm, the hand including a hand base and a finger, and a hand bracket unit between the hand base and the finger or between the hand base and the arm, the hand bracket unit including a vibration damping member and configured to damp vibration of the hand base or the finger.

In some example embodiments, the hand bracket unit may further include an outer bracket coupled to the hand base or the arm, and an inner bracket inside the outer bracket and attached to the finger or the hand base. The vibration damping member may include a lateral vibration damping sheet coupled between an outer sidewall of the inner bracket and an inner sidewall of the outer bracket to mitigate or prevent transmission of vibration between the inner bracket and the outer bracket. The lateral vibration damping sheet may have an area that may be larger than an area of one of sides of the finger. The lateral vibration damping sheet may include a viscoelastic material.

According to an example embodiment of the inventive concepts, a substrate handling apparatus includes a first equipment configured to perform a first treatment process on a substrate, a second equipment configured to perform a second treatment process on the substrate, and a robot configured to transfer the substrate between the first and second equipments. The robot may include a main body, an arm connected to the main body, a hand connected to the arm, the hand including a hand base and a finger, and a hand bracket unit between the hand base and the finger or between the hand base and the arm, the hand bracket unit including a vibration damping member and configured to damp vibration of the hand base or the finger.

According to an example embodiment of the inventive concepts, a robot includes a first member extending in a first direction, at least one second member extending in a second direction, the second direction crossing the first direction, and a bracket securing the second member to the first member, the bracket including a vibration damping member configured to damp transfer of vibration from the first member to the second member.

In some example embodiments, the first member may include a base of an object transfer hand and the second member includes at least one finger of the object transfer hand.

In some example embodiments, the first member may include a base of an object transfer hand and the second member includes an arm connected to a main body.

In some example embodiments, the bracket may include an inner bracket attached to the at least one finger and the base and an outer bracket coupled to and configured to cover the inner bracket.

In some example embodiments, the vibration damping member may include a lateral vibration damping sheet between the inner bracket and the outer bracket and a bottom vibration damping sheet between the outer bracket and the object transfer hand.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
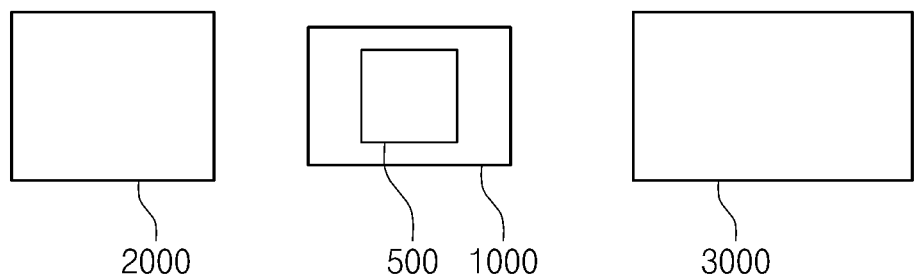
FIG. 1 is a schematic diagram illustrating a substrate handling apparatus according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments of the inventive concepts will now be described more fully with reference to the accompanying drawings, in which some example embodiments are shown. Example embodiments of the inventive concepts may, however, be embodied in many different forms and should not be construed as being limited to the example embodiments set forth herein; rather, these example embodiments are provided so that this disclosure will be thorough and complete, and will fully convey the scope of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, some example embodiments will be explained in further detail with reference to the accompanying drawings.

FIG. 1 is a schematic diagram illustrating a substrate handling apparatus according to an example embodiment of the inventive concepts. Referring to FIG. 1, a substrate handling apparatus includes a robot 1000, a first equipment 2000, and a second equipment 3000. The robot 1000 may be disposed between the first equipment 2000 and the second equipment 3000. For example, the robot 1000 may be configured to transfer a substrate 500 from the first equipment 2000 to the second equipment 3000 or vice versa. The substrate handling apparatus may be configured to transfer, for example, one substrate one at a time. The substrate 500 may include a flat glass or a wafer. The substrate 500 may have various shapes, for example, a hexahedral, spherical, or polygonal block. The first equipment 2000 may be configured to perform a first treatment process to the substrate 500. The first treatment process may include at least one of unit processes (e.g., polishing, deposition, photolithography, etching, ion implantation, and cleaning processes). The first treatment process may include, for example, a transferring process or a storing process.

The second equipment 3000 may be configured to perform a second treatment process to the substrate 500. For example, the second treatment process may include at least one of the unit processes, the transferring process, or the storing process. In certain example embodiments, one of the unit processes may include both the first treatment process and the second treatment process. The first equipment 2000 and the second equipment 3000 may be disposed adjacent to each other to successively perform the first and second treatment processes.

One or both of the first equipment 2000 and the second equipment 3000 may include, for example, a processing facility, a transferring facility, a storing facility, and a packaging facility. For example, each of the first equipment 2000 and the second equipment 3000 may include one of a spin coater, a baker, an edge remover, an exposing facility, a developing facility, a cleaning facility, a deposition facility, an etching facility, an ion-implantation facility, an ashing facility, a polishing facility, a cluster facility, a loader, an unloader, an automatic transferring facility, a manual transferring facility, a cassette, and/or a stocker. The first equipment 2000 and the second equipment 3000 may be disposed adjacent to each other in a fabrication line, in consideration of a process flow of the substrate 500.

Although not illustrated, the first equipment 2000 and the robot 1000 may be provided in a single body structure. Alternatively, the second equipment 3000 and the robot 1000 may be provided in a single body structure.

Figure 2:
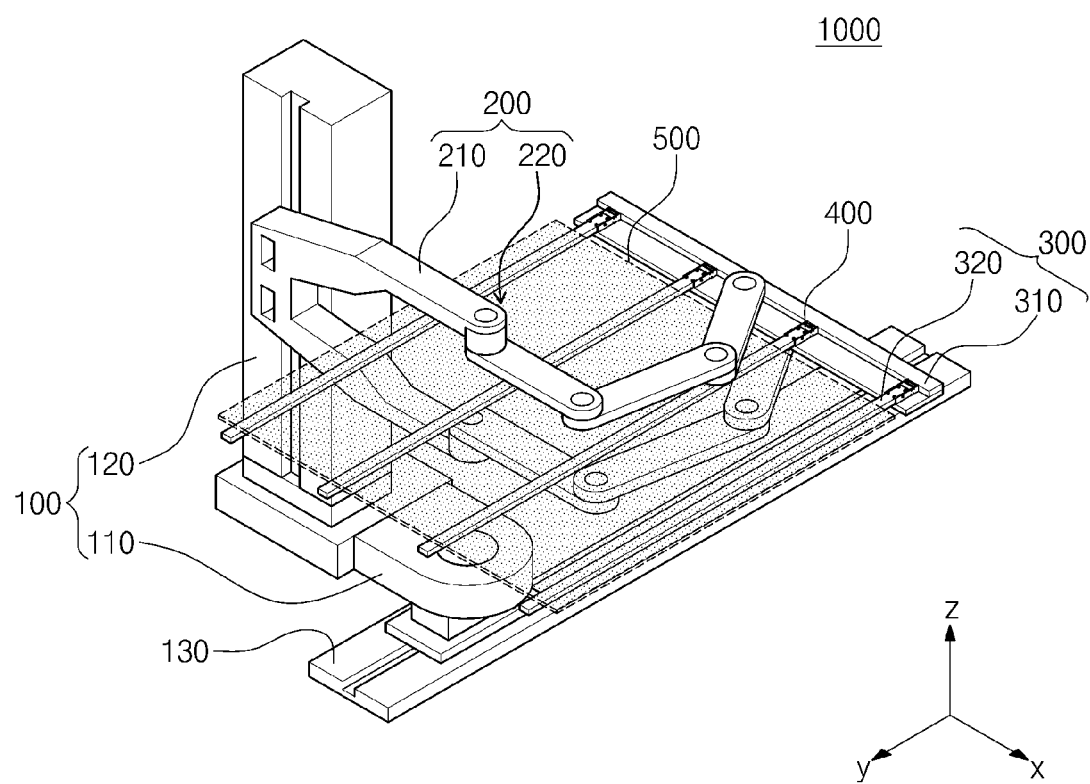
FIG. 2 is a perspective view of a robot of FIG. 1.

FIG. 2 is a perspective view of the robot 1000 of FIG. 1. Referring to FIG. 2, the robot 1000 includes a main body 100, an arm 200, a hand 300, and a hand bracket unit 400.

The main body 100 may be configured to support the arm 200 and the hand 300. The main body 100 may be configured to move the arm 200 and/or the hand 300 in horizontal and/or vertical directions. For example, the main body 100 may include a horizontal driving part 110 and a vertical driving part 120. The horizontal driving part 110 may be configured to move the arm 200 and/or the hand 300 along a direction and surface parallel to a floor of the fabrication line and/or rotate them with respect to a line normal to the floor. For example, the horizontal driving part 110 may be configured to move along a guide rail 130. Although not shown in the drawings, the guide rail 130 may extend along bottom, top, and/or side surfaces of the fabrication line or the floor of the fabrication line. The horizontal driving part 110 may include, for example, a driving arm.

The vertical driving part 120 may be configured to move the arm 200 and/or the hand 300 along a direction relative perpendicular to the moving direction of the horizontal driving part 110. For example, the vertical driving part 120 may include a driving elevator. The vertical driving part 120 may be provided on the horizontal driving part 110. Positions of the horizontal and vertical driving parts 110 and 120 may be exchanged to each other. Thus, although not shown in the drawings, the horizontal driving part 110 may be provided on the vertical driving part 120.

The arm 200 may include a first portion connected to the main body 100 and a second portion connected to the hand 300. The arm 200 may include a plurality of unit arms 210 and a plurality of joints 220. The arm 200 may be configured to move the hand 300 to a position spaced apart from the main body 100 and/or to another position adjacent to the main body 100.

Figure 3:
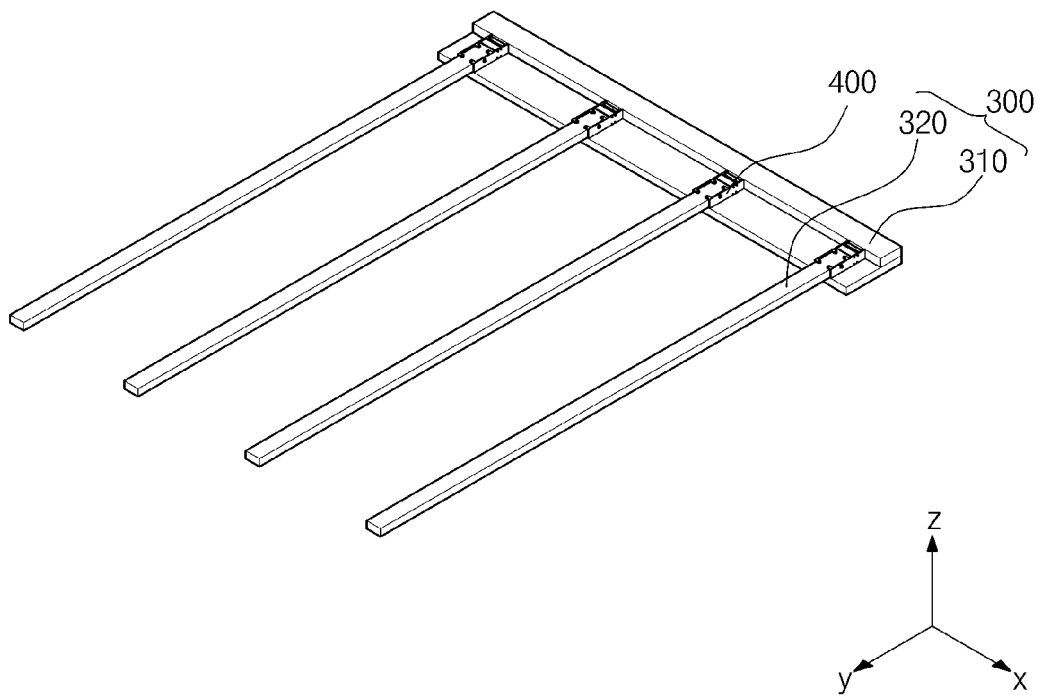
FIG. 3 is a perspective view of a hand of FIG. 2.

FIG. 3 shows the hand 300 and the hand bracket unit 400 of FIG. 2. Referring to FIGS. 2 and 3, the hand 300 may include a hand base 310 and fingers 320.

The hand base 310 may be connected to the arm 200. The hand base 310 may extend along a first direction. The first direction may be an x direction. In certain embodiments, the hand base 310 may comprise steel or an alloy metal. The arm 200 may be connected to, for example, a center of the hand base 310. For example, the arm 200 may be connected to a position or positions adjacent to an edge or edges of the hand base 310. The hand base 310 may be configured to rotate.

The fingers 320 may be connected to the hand base 310 such that they are parallel in a second direction, which crosses the first direction on a same level (or plane). For example, the second direction may be a y direction. The fingers 320 may be parallel to each other. For example, the fingers 320 may extend from the hand base 310 in the second direction. The hand base 310 may be configured to support the fingers 320. The fingers 320 may be formed of or include, for example, at least one of carbon fiber reinforced plastics, alloys, ceramics, or any combination thereof.

In the case that the fingers 320 are relatively long, the fingers may suffer from increased vibration due to a low flexural rigidity. For example, if the main body 100 and/or the arm 200 are accelerated, a forced vibration may occur. Amplitude of the forced vibration may increase in proportion to an external force exerted to the substrate 500. For example, the amplitude of the forced vibration may increase in proportion to, for example, a mass and/or an acceleration of the substrate 500. The mass of the substrate 500 may increase, for example, in proportion to an area of the substrate 500. The acceleration of the substrate 500 may increase, for example, in proportion to a transferring speed of the substrate 500. The fingers 320 may vibrate along with the substrate 500. The vibration of the substrate 500 and the fingers 320 may include the forced vibration and a non-linear vibration. The hand bracket units 400 may be configured to damp the vibration of the fingers 320. The hand bracket units 400 may connect the fingers 320 to the hand base 310. In the case where the hand base 310 is connected to the fingers 320 using, for example, bolts, the vibration of the fingers 320 may be transmitted to the arm 200 and thus to the main body 100 through the hand base 310. If the arm 200 and/or the main body 100 vibrate, then the hand 300 and the substrate 500 may more severely shake to cause an increased amplitude or displacement. According to some example embodiments of the inventive concepts, the hand bracket units 400 may be configured to mitigate or prevent the transmission of the vibration between the hand base 310 and the fingers 320. Further, the hand bracket unit 400 may be configured to damp such vibration.

Figure 4:
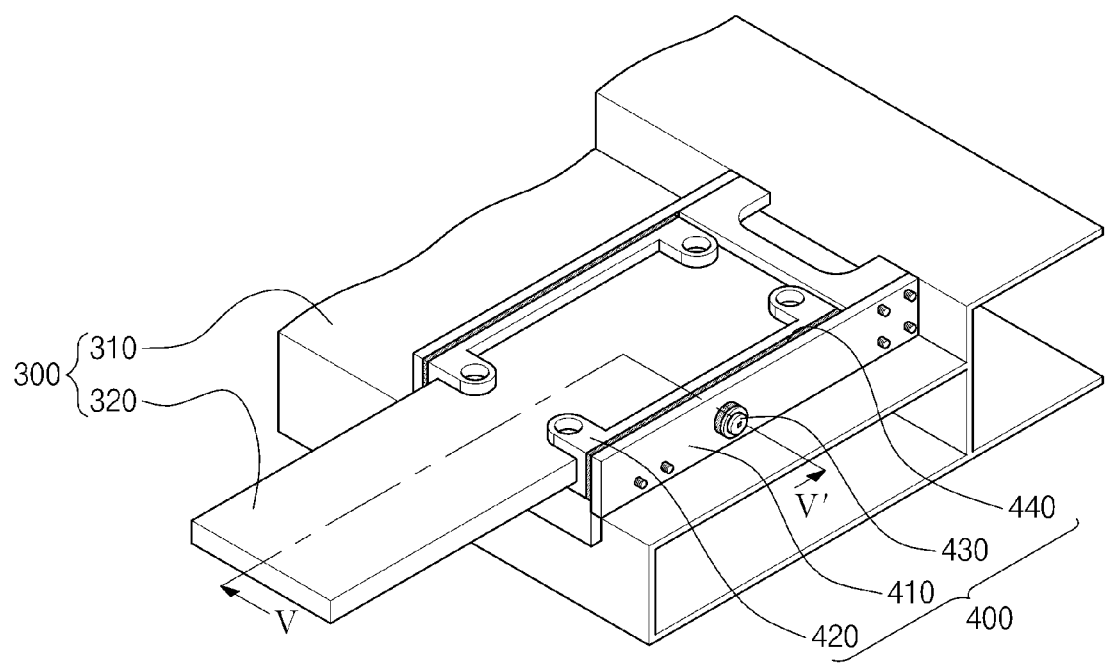
FIG. 4 is an enlarged perspective view of a hand bracket unit of FIG. 3.
Figure 5:
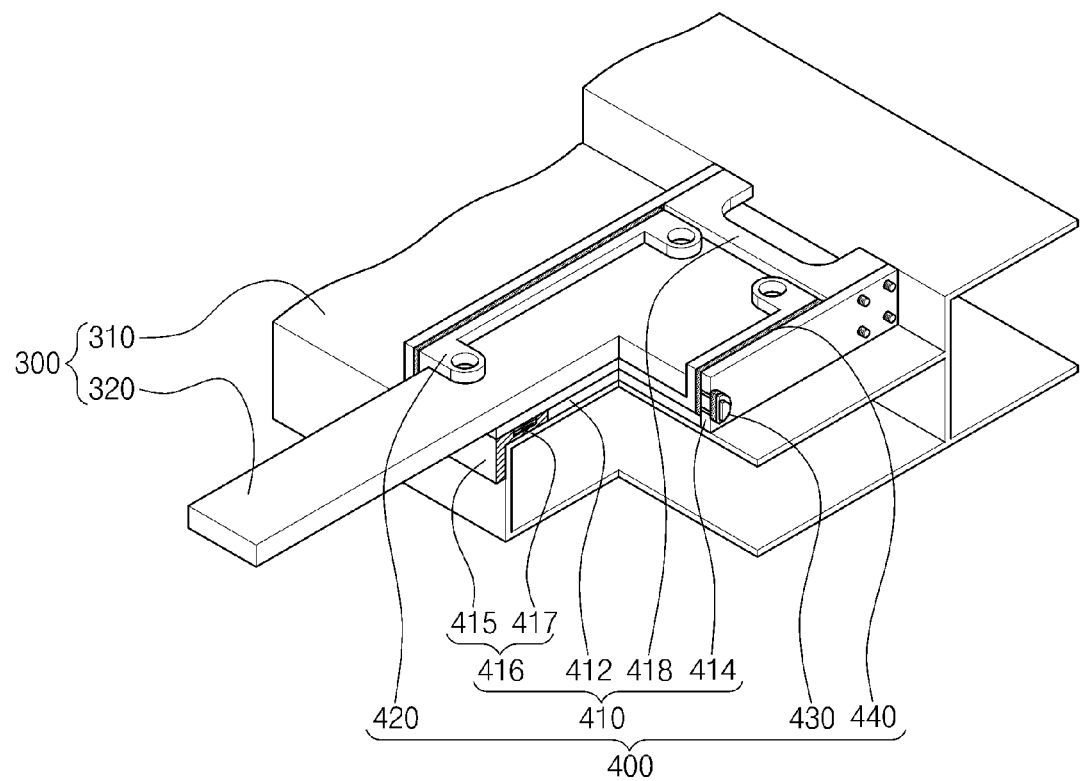
FIG. 5 is a perspective cut-away view illustrating the hand bracket unit that is taken along line V-V' of FIG. 4.
Figure 6:
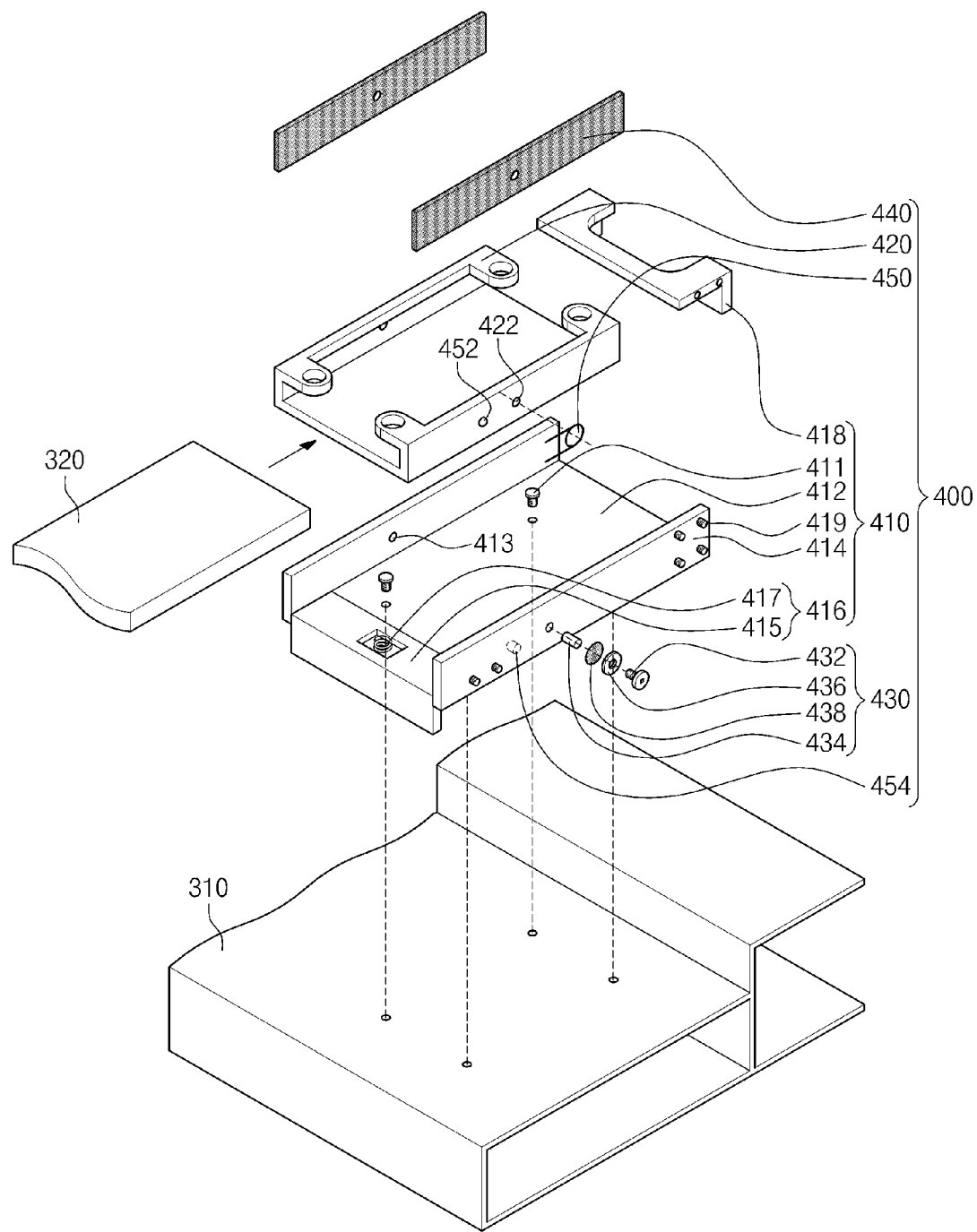
FIG. 6 is an exploded perspective view of the hand bracket unit of FIG. 4.
Figure 7:
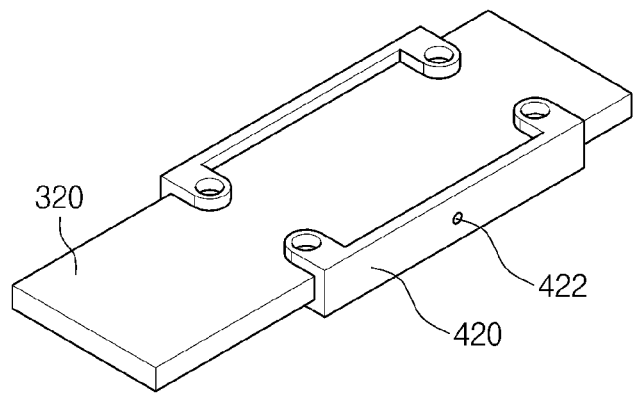
FIG. 7 is a perspective view illustrating a coupled structure of a finger and an inner bracket of FIG. 4.
Figure 8:
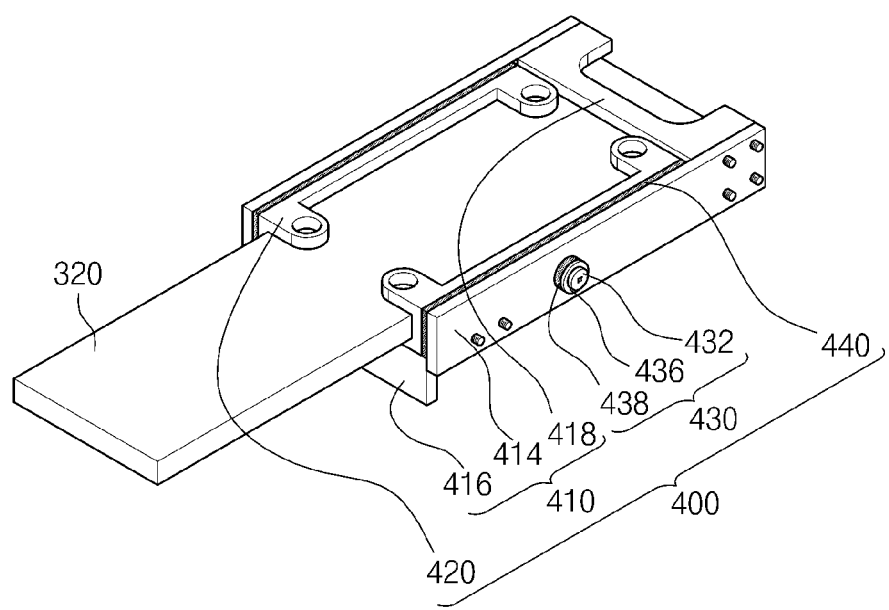
FIG. 8 is a perspective view illustrating a coupled structure of the finger, the inner bracket, an outer bracket, and lateral vibration damping sheets of FIG. 4.

FIG. 4 is an enlarged perspective view of the hand bracket unit 400. FIG. 5 is a perspective view illustrating the hand bracket unit that is taken along line V-V' of FIG. 4. FIG. 6 is an exploded perspective view of the hand bracket unit 400 of FIG. 4. FIG. 7 is a perspective view illustrating a coupled structure of the finger 320 and an inner bracket 420 of FIG. 4. FIG. 8 is a perspective view illustrating a coupled structure of the finger 320, the inner bracket 420, an outer bracket 410, and lateral vibration damping sheets 440 of FIG. 4.

Referring to FIGS. 4 through 6, the hand bracket unit 400 include the outer bracket 410, the inner bracket 420, a shaft member 430, the lateral vibration damping sheets 440, and a torsion spring 450. The outer bracket 410 may be coupled to a top surface of the hand base 310. The outer bracket 410 may cover, surround, or enclose the inner bracket 420, in which the finger 320 is accommodated. For example, the finger 320, which is disposed in the inner bracket 420, may be accommodated in an inner space defined by the outer bracket 410.

For example, the outer bracket 410 may include a bottom plate 412, a plurality of side plates 414, a gravity compensation part 416, and a clamp 418.

The bottom plate 412 may be provided on the hand base 310. The bottom plate 412 may be attached to the hand base 310 by first fixing bolts 411. The inner bracket 420 may be provided on the bottom plate 412. The bottom plate 412 may have, for example, a rectangular parallelepiped structure.

A plurality of side plates 414 may be provided at both sides of the bottom plate 412 and/or the inner bracket 420 to face each other. Second fixing bolts 419 may be provided to connect the side plates 414 to the bottom plate 412. The side plates 414 may be attached to a side surface of the bottom plate 412. The side plates 414 may protect the inner bracket 420. Further, the side plates 414 may serve as a supporting structure for the shaft member 430. The side plates 414 may have first holes 413 defined therein. The first holes 413 may be aligned along the first direction.

The gravity compensation part 416 may be provided between the side plates 414. The gravity compensation part 416 may be provided adjacent to one edge of the bottom plate 412 in the extension direction of the fingers 320 or in the second direction. The gravity compensation part 416 may be configured to support the inner bracket 420. The inner bracket 420 may be provided on the gravity compensation part 416 and configured to disperse a weight of the finger 320.

In some example embodiments, the gravity compensation part 416 may include an edge bar 415 and a spring 417. The edge bar 415 may be parallel to a direction crossing the finger 320 in a direction thereof, which is perpendicular to the extension direction of the finger 320. For example, the edge bar 415 and the hand base 310 may extend along the same direction. The edge bar 415 may mitigate or prevent the finger 320 from drooping. For example, the edge bar 415 may serve as a structure for supporting the finger 320.

The spring 417 may be an elastic element capable of compensating a weight of the finger 320. The spring 417 may be disposed adjacent to the edge bar 415. For example, the spring 417 may be provided in a hole defined in the edge bar 415. The spring 417 may be, for example, a spiral spring, a compression spring, or a leaf spring.

The torsion spring 450 may be disposed between the outer bracket 410 and the inner bracket 420. The torsion spring 450 may be disposed adjacent to the first holes 413. An end portion of the torsion spring 450 may be attached to an inner protrusion 452 of the inner bracket 420. The inner protrusion 452 of the inner bracket 420 may protrude at a side surface of the inner bracket 420 toward the side plates 414 of the outer bracket 410. Other end portion of the torsion spring 450 may be attached to an outer protrusion 454 protruding from the side plate 414 of the outer bracket 410. The torsion spring 450 may be coupled to the shaft member 430. The torsion spring 450 may suppress the vibration of the inner bracket 420 from being transmitted to the outer bracket 410. The clamp 418 may be provided at an opposite side of the outer bracket 410 with respect to the gravity compensation part 416 and configured to attach the inner bracket 420 and the finger 320 to the bottom plate 412. The clamp 418 may be configured to clamp a portion of the finger 320 projecting from the inner bracket 420. The clamp 418 may be attached to the side plates 414 by the second fixing bolts 419.

Referring to FIGS. 4 through 7, the finger 320 may be inserted into the inner bracket 420. For example, the finger 320 may move through the inner bracket 420, and the inner bracket 420 may at least partially surround, enclose, or fully surround the finger 320. In some example embodiments, the inner bracket 420 may be provided in the form of a single body (e.g., an integral body or a unitary structure). In some example embodiments, the inner bracket 420 may include a plurality of assembled parts provided around the finger 320. The inner bracket 420 may be attached to the finger 320 using, for example, a bolt or an epoxy. The finger 320 may be provided such that an end portion thereof projects outside the inner bracket 420. The inner bracket 420 may have second holes 422 defined therein. The second holes 422 may be aligned along the first direction. The second holes 422 may be aligned to the first holes 413. The shaft member 430 may be provided to penetrate the first and second holes 413 and 422 such that the inner bracket 420 is coupled to the outer bracket 410. The inner bracket 420 may be provided on the bottom plate 412 and the gravity compensation part 416. The inner bracket 420 may be provided between the side plates 414. The outer protrusion 454 may be formed on an outer sidewall of the outer bracket 410 adjacent to the first hole 413. The end portion of the finger 320 projecting outside the inner bracket 420 may be clamped by the clamp 418.

The shaft member 430 may connect the outer bracket 410 to the inner bracket 420. For example, the side plate 414 may be connected to a sidewall of the inner bracket 420 by the shaft member 430. The shaft member 430 may include, for example, a shaft bolt 432, a rotary joint 434, a washer 436, and a shaft vibration damping ring 438. In certain example embodiments, the shaft member 430 may be a single body (e.g., an integral or unitary structure) with the inner bracket 420.

The shaft bolt 432 may pass through the torsion spring 450, the rotary joint 434, the washer 436, and the shaft vibration damping ring 438. The shaft bolt 432 may be coupled to one of the second holes 422, which are formed on the sidewall of the inner bracket 420.

For example, the rotary joint 434 may pass through and attached to the first hole 413. The shaft bolt 432 may penetrate the rotary joint 434. The shaft bolt 432 may be rotatable in the rotary joint 434.

For example, the washer 436 may be provided between a head of the shaft bolt 432 and the side plate 414. By using the washer 436, a pressure exerted to the head of the shaft bolt 432 may be dispersed to the side plate 414. Further, the washer 436 may mitigate or prevent the shaft bolt 432 from being released.

For example, the shaft vibration damping ring 438 may be provided between the washer 436 and the side plates 414. The shaft vibration damping ring 438 may prevent or suppress transmission of vibration, for example, between the shaft bolt 432 and the side plates 414. For example, the shaft vibration damping ring 438 may have the same shape and size as the washer 436. The shaft vibration damping ring 438 may be formed of a viscoelastic material. A silicone polymer may be an example of such a viscoelastic material.

In certain example embodiments, the inner bracket 420 and the finger 320 may be rotatable about the shaft bolt 432. For example, the inner bracket 420 and the finger 320 may be semi-attached to each other by the gravity compensation part 416 and the clamp 418. The finger 320 may be configured to rotate in an upward direction and not rotate in a downward direction. The gravity compensation part 416 and the clamp 418 may be configured to prohibit a portion or portions of the finger 320 connected to the hand base 310 from moving or rotating in the downward direction in order for the fingers 320 to stably support the substrate 500.

Referring to FIGS. 4 through 8, the clamp 418 and the gravity compensation part 416 may be disposed at opposite sides in an extension direction of the finger 320 with respect to the shaft bolt 432. The inner bracket 420 and the finger 320 may be attached to the clamp 418 and the bottom plate 412. For example, the inner bracket 420 may be attached to the gravity compensation part 416 and the bottom plate 412 using the shaft bolt 432. The clamp 418 and the inner bracket 420 may be configured to attach the finger 320.

The lateral vibration damping sheets 440 may be provided between the outer bracket 410 and the inner bracket 420. The lateral vibration damping sheets 440 may be provided between the side plates 414 and outer sidewalls of the inner bracket 420. The lateral vibration damping sheets 440 may mitigate or prevent transmission of vibration between the outer bracket 410 and the inner bracket 420. For example, the lateral vibration damping sheets 440 may be formed of or include a polymer viscoelastic material.

In the case where the lateral vibration damping sheets 440 have a relatively large area, transmission of the vibration may be more effectively prevented or mitigated. The inner bracket 420 and the outer bracket 410 may be configured to have a relatively large contact area with the lateral vibration damping sheet 440. For example, the lateral vibration damping sheets 440 may have the same area as an outer side surface of the inner bracket 420. For example, the area of the lateral vibration damping sheet 440 may be larger than an area of one of sides of the finger 320 in the hand bracket unit 400. The vibration damping sheet 440 effectively suppress transmission of the vibration of the finger 320 toward the hand base 310.

Figure 9:
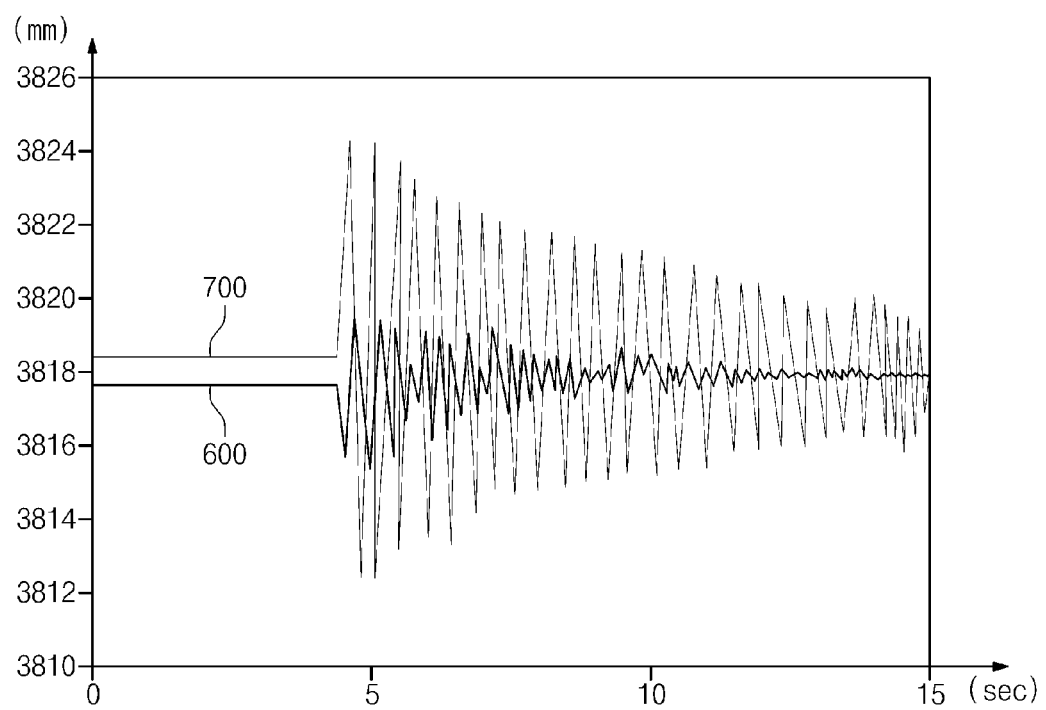
FIG. 9 is a graph showing vibration-damping curves measured from robots, one of which includes the lateral vibration damping sheets and the shaft vibration damping ring shown in FIGS. 4 and 6, and the other of which does not includes the lateral vibration damping sheets according to a conventional technology.

FIG. 9 is a graph showing vibration-damping curves measured from robots, one of which includes the lateral vibration damping sheets 440 and the shaft vibration damping ring 438 shown in FIGS. 4 and 6, and the other of which does not includes the lateral vibration damping sheets according to a conventional technology.

Referring to FIG. 9, a vibration damping curve 600 shows a smaller displacement than a vibration damping curve 700. In FIG. 9, the horizontal axis represents a measurement time in seconds, and the vertical axis represents a measured displacement. The vibration damping graphs 600 and 700 were measured under the same measurement condition (for example, in terms of a magnitude of an external force or an external vibration). FIG. 9 shows that the lateral vibration damping sheets 440 and/or the shaft vibration damping ring 438 can reduce transmission of vibration energy between the outer bracket 410 and the inner bracket 420. Thus, by using the hand bracket unit 400 according to some example embodiments of the inventive concepts, vibration of the hand 300 can be effectively damped.

Figure 10:
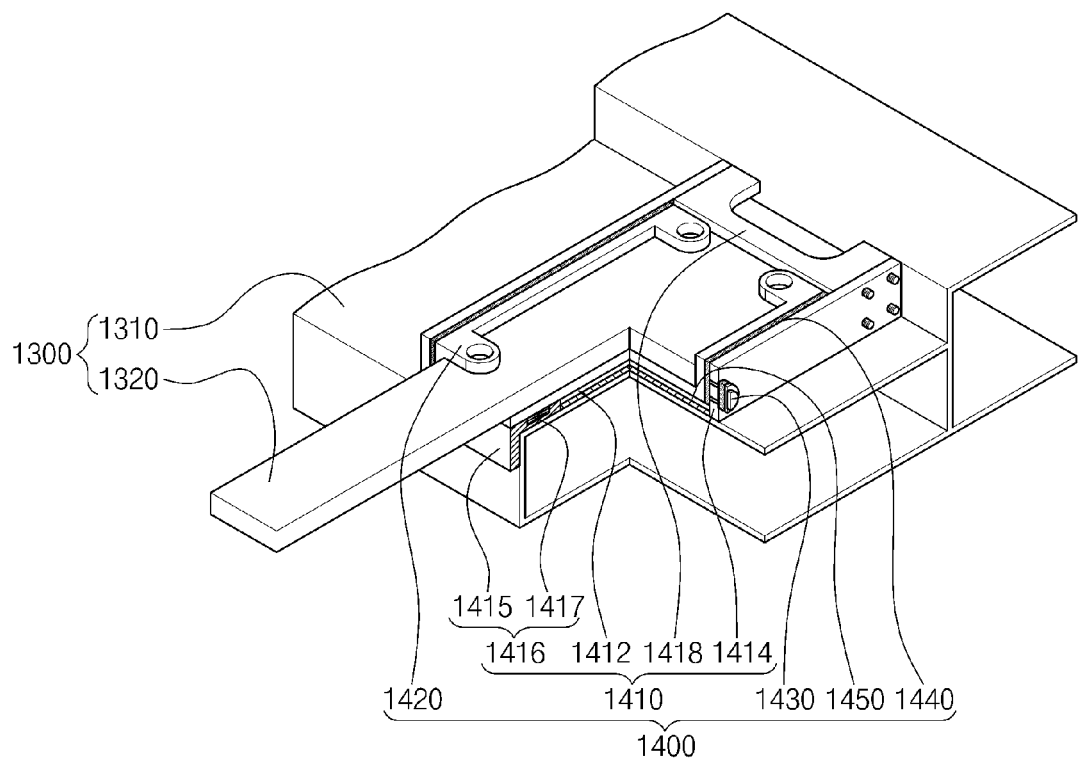
FIG. 10 is a perspective view illustrating a hand bracket unit according to an example embodiment of the inventive concepts.

FIG. 10 is a perspective view illustrating a hand bracket unit 1400 according to an example embodiment of the inventive concepts. The hand bracket unit 1400 of FIG. 10 includes an outer bracket 1410, an inner bracket 1420, an shaft member 1430, and lateral vibration damping sheets 1440, which are the same as the outer bracket 410, the inner bracket 420, the shaft member 430, and the lateral vibration damping sheets 440 of the hand bracket unit 400 of FIG. 5, except for include a bottom vibration damping sheet 1450. Accordingly, for concise description, overlapping description thereof will be omitted.

The bottom vibration damping sheet 1450 may be disposed between the outer bracket 1410 and a hand base 1310. The bottom vibration damping sheet 1450 may be configured to prevent and/or suppress transmission of vibration between the outer bracket 1410 and the hand base 1310. For example, a bottom vibration damping sheet 1450 may be provided between a bottom plate 1412 of the outer bracket 1410 and the hand base 1310. The bottom vibration damping sheet 1450 may be formed of or include, for example, a polymer viscoelastic material.

Figure 11:
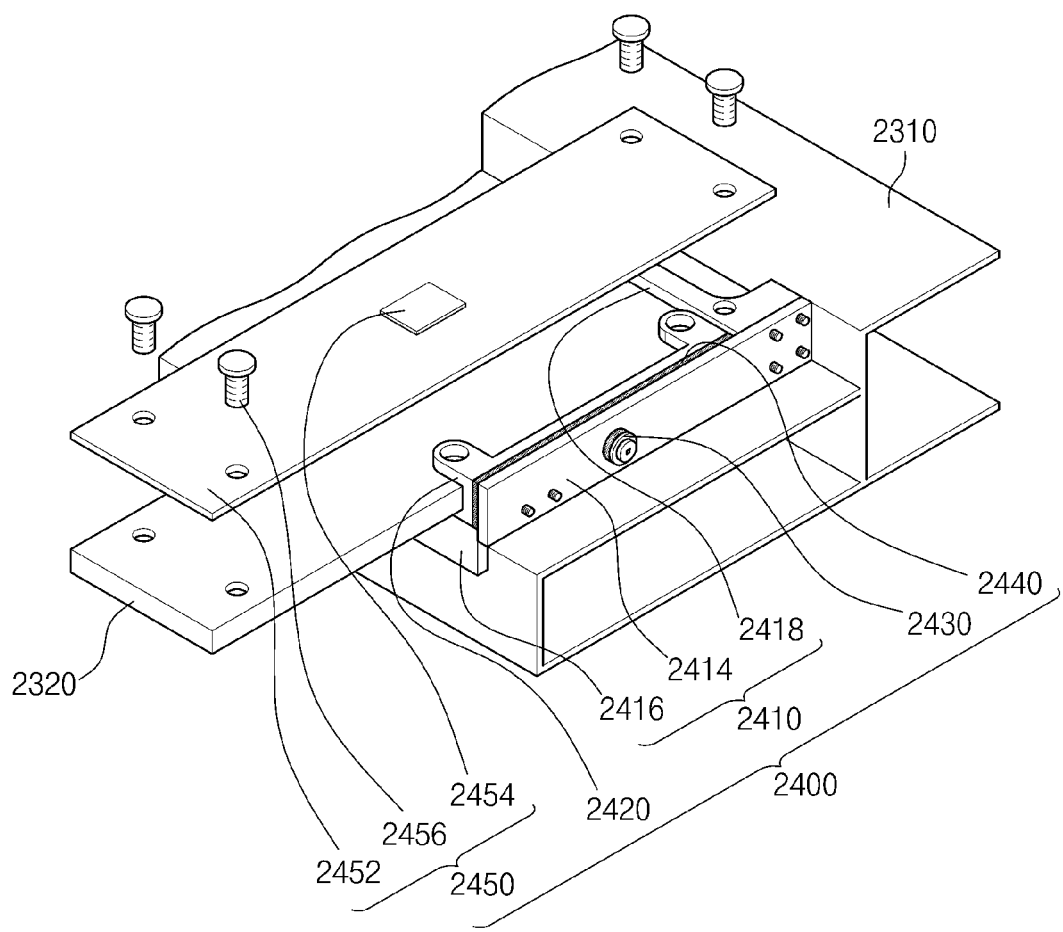
FIG. 11 is a perspective view illustrating a hand bracket unit according to another embodiment of the inventive concepts.

FIG. 11 is a perspective view illustrating a hand bracket unit 2400 according to another example embodiment of the inventive concepts. The hand bracket unit 2400 of FIG. 11 may include an outer bracket 2410, an inner bracket 2420, a shaft member 2430, and lateral vibration damping sheets 2440, which are the same as the outer bracket 410, the inner bracket 420, the shaft member 430, and the lateral vibration damping sheets 440 of the hand bracket unit 400 of FIG. 5, except for an active vibration damping device 2450. Accordingly, for concise description, overlapping description thereof will be omitted.

The active vibration damping device 2450 may be configured to actively remove or reduce vibration of a finger 2320. For example, the active vibration damping device 2450 may include, for example, a piezo-electric plate 2452, a sensor 2454, and third fixing bolts 2456.

The piezo-electric plate 2452 may be disposed on the finger 2320. For example, the piezo-electric plate 2452 may include two portions that are attached to a clamp 2418 and the finger 2320, respectively. The third fixing bolts 2456 may connect the two portions of the piezo-electric plate 2452 to the clamp 2418 and the finger 2320, respectively. The piezo-electric plate 2452 may be configured to remove or reduce vibration of the finger 2320 using an external electric signal or power.

The sensor 2454 may be configured to monitor the vibration of the finger 2320 and/or the piezo-electric plate 2452. The sensor 2454 may be provided on the piezo-electric plate 2452. Based on monitoring signals obtained by the sensor 2454, the control unit (not shown) may control an operation of the piezo-electric plate 2452.

For example, vibration of the finger 2320 can be actively removed or reduced by using the hand bracket unit 2400.

Figure 12:
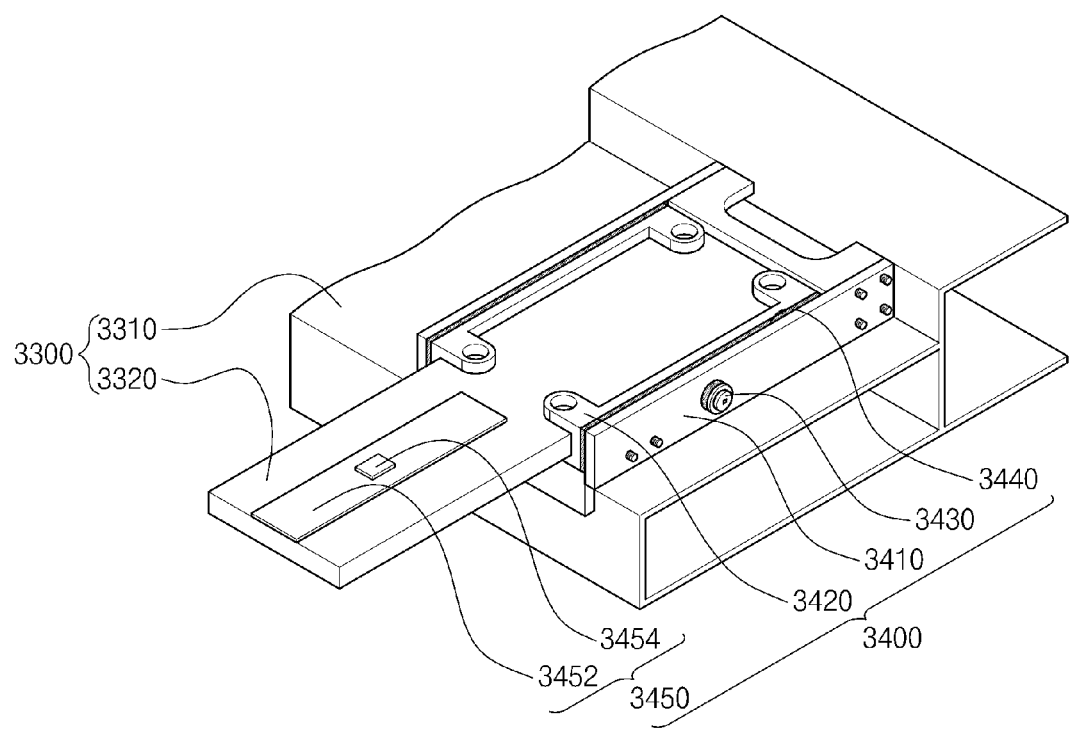
FIG. 12 is a perspective view illustrating a hand bracket unit according to a still another example embodiment of the inventive concepts.

FIG. 12 is a perspective view illustrating a hand bracket unit 3400 according to still another example embodiment of the inventive concepts.

A vibration damping device 3450 of FIG. 12 may include a piezo-electric plate 3452 and a sensor 3454. The piezo-electric plate 3452 may be provided on a finger 3320. For example, the piezo-electric plate 3452 may be in direct contact with a top surface of the finger 3320. The sensor 3454 may be provided on the piezo-electric plate 3452. For example, the sensor 3454 may be in direct contact with a top surface of the finger 3320. The sensor 3454 may be configured to monitor or sense vibration of the finger 3320 and/or the piezo-electric plate 3452. The piezo-electric plate 3452 may damp or suppress actively the vibration of the finger 3320 in response to a control signal.

Figure 13:
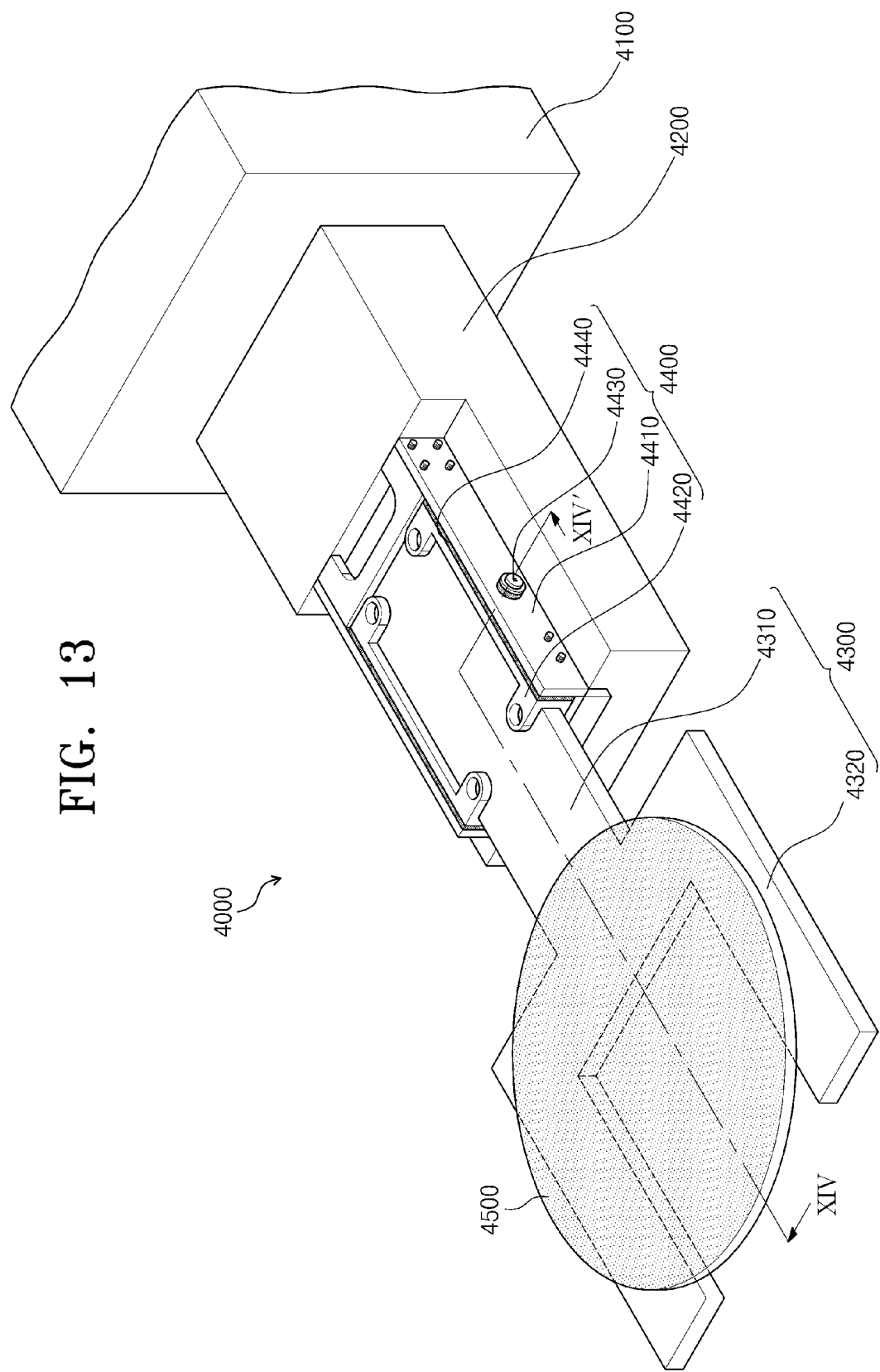
FIG. 13 is a diagram illustrating a robot according to another example embodiment of the inventive concepts.
Figure 14:
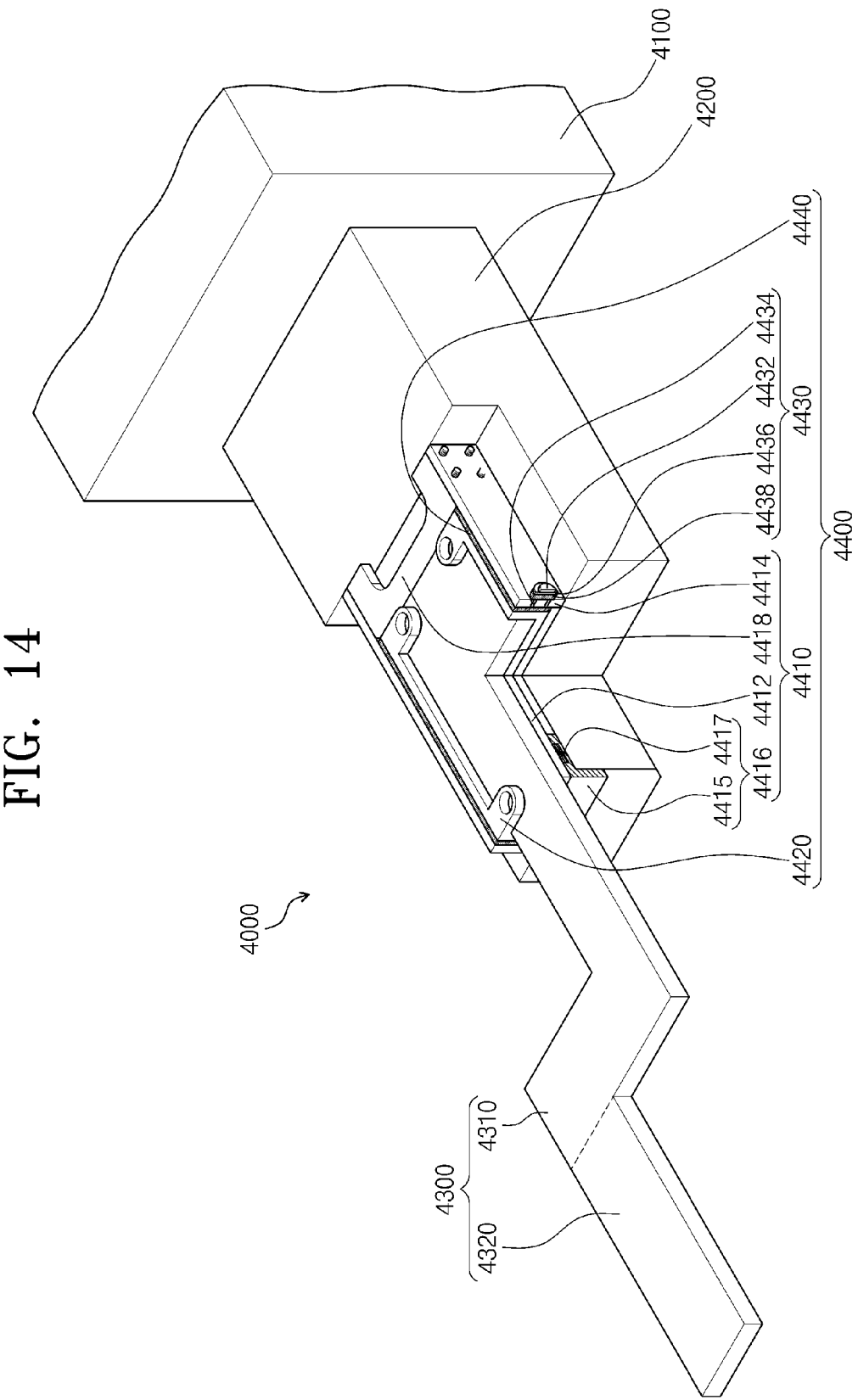
FIG. 14 is a perspective cut-away view illustrating the hand bracket unit that is taken along line XIV-XIV' of FIG. 13.

FIG. 13 is a diagram illustrating a robot 4000 according to another example embodiment of the inventive concepts. FIG. 14 is a perspective cut-away view illustrating the hand bracket unit 4400 that is taken along line XIV-XIV' of FIG. 13.

Referring to FIGS. 13 and 14, the robot 4000 includes a main body 4100, an arm 4200, a hand 4300, and a hand bracket unit 4400.

The arm 4200 may include a portion connected to the main body 4100 and other portion connected to the hand bracket unit 4400 and the hand 4300.

The hand 4300 may be configured to support a substrate 4500. For example, the hand 4300 may have a fork shape. For example, the hand 4300 may include a hand base 4310 and fingers 4320. The fingers 4320 may be connected to the hand base 4310. The hand base 4310 and the fingers 4320 may be provided in a single body (e.g., an integral body or unitary structure). The substrate 4500 may be loaded on the hand base 4310 and/or the fingers 4320 of the hand 4300. The hand base 4310 and the fingers 4320 may vibrate along with the substrate 4500.

The hand bracket unit 4400 may connect the arm 4200 to the hand 4300. The hand bracket unit 4400 may be configured to damp vibration of the substrate 4500 and/or the hand 4300. The hand bracket unit 4400 may include, for example, an outer bracket 4410, an inner bracket 4420, a shaft member 4430, and lateral vibration damping sheets 4440.

The outer bracket 4410 may be attached to a top surface of the arm 4200. For example, the outer bracket 4410 may include a bottom plate 4412, side plates 4414, a gravity compensation part 4416, and a clamp 4418. The bottom plate 4412 may be provided on the arm 4200. The side plates 4414 may be attached to opposite edge portions of the bottom plate 4412, respectively. The gravity compensation part 4416 may be provided between the side plates 4414 and on one edge portion of the bottom plate 4412. The clamp 4418 may be provided on other edge portion of the bottom plate 4412, the other edge portion being opposite to the one edge portion at which the gravity compensation part 4416 is provided. The clamp 4418 may be attached to the side plates 4414.

The inner bracket 4420 may be attached to the hand base 4310. The hand base 4310 may be configured to pass through the inner bracket 4420, and the inner bracket 4420 may enclose, surround, or cover at least a portion of the hand base 4310. The gravity compensation part 4416 may support a portion of the inner bracket 4420 located apart from a center of the shaft member 4430. The clamp 4418 may be configured to clamp an edge portion of the hand base 4310 that projects outside the inner bracket 4420 toward an opposite direction of the gravity compensation part 4416.

The shaft member 4430 may connect the outer bracket 4410 with the inner bracket 4420. For example, the shaft member 4430 may connect sidewalls of the inner bracket 4420 with the side plates 4414. The shaft member 4430 may include, for example, a shaft bolt 4432, a rotary joint 4434, a washer 4436, and a shaft vibration damping ring 4438. The rotary joint 4434 may be provided in a first hole (not shown) defined in the side plate 4414. The shaft bolt 4432 may penetrate the rotary joint 4434 and may be attached to a second hole (not shown), which is formed on a sidewall of the inner bracket 4420. The washer 4436 may be disposed between a head of the shaft bolt 4432 and the side plate 4414. The shaft vibration damping ring 4438 may be disposed between the washer 4436 and the side plates 4414. The shaft vibration damping ring 4438 may be provided between the shaft bolt 4432 and the side plates 4414 and configured to absorb vibration energy being transmitted therebetween.

The lateral vibration damping sheets 4440 may be provided between the outer bracket 4410 and the inner bracket 4420. For example, the lateral vibration damping sheets 4440 may be provided between outer sidewalls of the inner bracket 4420 and the side plates 4414. In the case where the lateral vibration damping sheets 4440 have a relatively large area, transmission of the vibration may be effectively mitigated or prevented. The inner bracket 4420 and the outer bracket 4410 may be configured to have a relatively large contact area with the lateral vibration damping sheets 4440. For example, the lateral vibration damping sheets 4440 may have the same area as an outer side surface of the inner bracket 4420. The area of the lateral vibration damping sheet 4440 may be larger than a side area of the hand base 4310 in the hand bracket unit 4400. The lateral vibration damping sheets 4440 may have an area lager than a side area of finger 4320. The lateral vibration damping sheets 4440 may effectively suppress transmission of vibration of the hand 4300.

Although not shown, the hand bracket unit 4400 may further include at least one of the bottom vibration damping sheet 1450 or the active vibration damping devices 2450 and 3450 described with reference to FIGS. 10 and 12. The bottom vibration damping sheet 1450 may be provided between the bottom plate 4412 and the arm 4200. The piezo-electric plate 2452 of the active vibration damping device 2450 may be provided between the finger 4320 and the clamp 4418. For example, the active vibration damping device 3450 may be provided on the finger 3320.

According to example embodiments of the inventive concepts, a robot may include a hand bracket unit that is configured to effectively damp or suppress vibration of a substrate.

While a few example embodiments of the inventive concepts have been particularly shown and described, it will be understood by one of ordinary skill in the art that variations in form and detail may be made therein without departing from the spirit and scope of the attached claims.

What is claimed is:

1. A robot, comprising:
   a main body;
   an arm connected to the main body;
   a hand connected to the arm, the hand including a hand base and a finger; and
   a hand bracket unit between the hand base and the finger or between the hand base and the arm, the hand bracket unit configured to damp vibration of the hand base or the finger, the hand bracket unit including,
      an outer bracket coupled to the hand base or the arm,
      an inner bracket inside the outer bracket and attached to the finger or the hand base,
      a vibration damping member between the outer bracket and the inner bracket, and
      a shaft member connecting the outer bracket to the inner bracket,
   wherein the outer bracket includes,
      a bottom plate,
      a plurality of side plates at both sides of the bottom plate, and
      a first spring between the bottom plate and the inner bracket.

2. The robot of claim 1, wherein the vibration damping member comprises,
   a lateral vibration damping sheet between the inner bracket and the outer bracket, the lateral vibration damping sheet configured to mitigate transmission of vibration between the inner bracket and the outer bracket.

3. The robot of claim 2, wherein the lateral vibration damping sheet has an area larger than an area of one of sides of the finger.

4. The robot of claim 2, wherein the lateral vibration damping sheet comprises a viscoelastic material.

5. The robot of claim 1, wherein the outer and inner brackets include first and second holes, respectively, each of which exposes therethrough a sidewall of the finger or the hand base, and
   the shaft member is configured to couple the outer bracket with the inner bracket through the first and second holes.

6. The robot of claim 5, wherein the shaft member comprises:
   a rotatable shaft disposed in the first hole;
   a shaft bolt coupling the outer bracket with the inner bracket, the shaft bolt passing through the rotatable shaft and the second hole;
   a washer between a head of the shaft bolt and the outer bracket; and
   a vibration damping ring between the washer and the outer bracket.

7. The robot of claim 1, wherein:
   the bottom plate is fixed to the hand base; and
   the side plates are coupled to the inner bracket by the shaft member.

8. The robot of claim 7, wherein each of the side plates of the outer bracket includes an outer protrusion adjacent to the first hole,
   the inner bracket includes an inner protrusion adjacent to the second hole, and
   the vibration damping member further comprises a second spring, the second spring being a torsion spring between the inner bracket and the side plates of the outer bracket, the second spring coupling the inner protrusion to the outer protrusion.

9. The robot of claim 7, wherein the vibration damping member further comprises:
a bottom vibration damping sheet between the bottom plate and the hand base or between the bottom plate and the arm.

10. The robot of claim 7, wherein
the finger or the hand base passes through the inner bracket, and
the outer bracket further includes,
an edge bar of an edge portion of the bottom plate to cross the finger in a width direction thereof; and
a clamp clamping a portion of the finger or the hand base, the clamp projecting above the inner bracket, wherein the first spring and the clamp are respectively adjacent to two opposite edge portions of the bottom plate in a length direction thereof,
wherein the first spring is disposed adjacent to the edge bar to damp vibration of the finger.

11. The robot of claim 10, wherein
the hand bracket unit includes an active vibration damping device,
the active vibration damping device is between the clamp and the finger, and
the active vibration damping device includes,
a piezo-electric plate;
a sensor disposed on the piezo-electric plate to monitor vibration of the piezo-electric plate or the finger; and
fastening member attaching the piezo-electric plate to the clamp and the finger.

12. The robot of claim 1, wherein the hand bracket unit further comprises:
an edge bar at an edge of the bottom plate adjacent to the spring, the edge bar configured to support the inner bracket.

13. A robot, comprising:
a first member extending in a first direction;
at least one second member connected to the first member and extending in a second direction, the second direction crossing the first direction; and
a bracket configured to secure the second member to the first member, the bracket including,
an outer bracket,
an inner bracket inside the outer bracket,
a vibration damping member between the outer bracket and the inner bracket and configured to damp transfer of vibration from the first member to the second member, and
a shaft member connecting the outer bracket to the inner bracket,
wherein the outer bracket includes,
a bottom plate,
a plurality of side plates at both sides of the bottom plate, and
a spring between the bottom plate and the inner bracket.

14. The robot of claim 13, wherein the first member includes a base of an object transfer hand and the second member includes at least one finger of the object transfer hand.

15. The robot of claim 13, wherein the first member includes a base of an object transfer hand and the second member includes an arm connected to a main body.

16. The robot of claim 13, wherein the vibration damping member includes a lateral vibration damping sheet between the inner bracket and the outer bracket and a bottom vibration damping sheet between the outer bracket and the object transfer hand.

17. A robot, comprising:
a main body;
an arm connected to the main body;
a hand connected to the arm, the hand including a hand base and a finger; and
a hand bracket unit between the hand base and the finger or between the hand base and the arm, the hand bracket unit configured to damp vibration of the hand base or the finger, the hand bracket unit including,
an outer bracket coupled to the hand base or the arm,
an inner bracket inside the outer bracket and attached to the finger or the hand base,
a vibration damping member including a plurality of lateral vibration damping sheets between the outer bracket and the inner bracket, the plurality of lateral vibration damping sheets each having an area larger than an area of a longitudinal side of the finger in the hand bracket unit or an area of
a longitudinal side of the hand base in the in hand bracket unit.

18. The robot of claim 17, wherein the outer bracket includes:
a plate member including a bottom plate and a plurality of side plates on both sides of the bottom plate;
an edge bar at an edge of the bottom plate, the edge bar configured to support the inner bracket; and
a spring between the bottom plate and the finger or between the bottom plate and the hand base, the spring disposed at a hole defined in the edge bar.

* * * * *